(12) United States Patent  
Itakura (10) Patent No.: US 7,923,990 B2  
(45) Date of Patent: Apr. 12, 2011

(54) WAFER HOLDER

(75) Inventor: Yo Itakura, Itabashi-ku (JP)

(73) Assignee: Kabushiki Kaisha TOPCON, Tokyo (JP)

( * ) Notice: Subject to any disclaimer, the term of this patent is extended or adjusted under 35 U.S.C. 154(b) by 179 days.

(21) Appl. No.: 12/288,284

(22) Filed: Oct. 17, 2008

(65) Prior Publication Data

US 2009/0110521 A1    Apr. 30, 2009

(30) Foreign Application Priority Data

Oct. 25, 2007    (JP) ................................. 2007-277162

(51) Int. Cl.  
*G01R 31/28*    (2006.01)

(52) U.S. Cl. .................................... 324/158.1
(58) Field of Classification Search ........................ None  
See application file for complete search history.

(56) References Cited

U.S. PATENT DOCUMENTS 6,137,303 A * 10/2000 Deckert et al. ................ 324/765

FOREIGN PATENT DOCUMENTS

JP    2003-324143    11/2003

* cited by examiner

*Primary Examiner* — Roberto Velez  
(74) *Attorney, Agent, or Firm* — Chapman and Cutler LLP (57) ABSTRACT

A wafer holder is provided which includes a holder body with a chuck table having a ring-like wafer receptacle, and a plurality of fixing portions fixing a wafer on the wafer receptacle to hold the wafer, and a carrier supporting the wafer before fixed on the wafer receptacle from downward. The holder body includes a carrier support portion which forms a support face to support the carrier and be changeable in height from an original position, and positions the support face on which the wafer is placed at a delivery position. The carrier support portion separates the wafer from the carrier by lowering the support face from the delivery position, so that the fixing portions fix the wafer.

6 Claims, 6 Drawing Sheets

WAFER HOLDER

CROSS REFERENCE TO RELATED APPLICATION

The present application is based on and claims priority from Japanese Patent Application No. 2007-277162, filed on Oct. 25, 2007, the disclosure of which is hereby incorporated by reference in its entirety.

BACKGROUND OF THE INVENTION

1. Field of the Invention

The present invention relates to a wafer holder for a chip inspection apparatus which moves a wafer to inspect a chip thereon in a semiconductor manufacture process, for example.

2. Description of Related Art

There are various known wafer holding devices such as ones used in a chip inspection apparatus which inspects a chip on a wafer while moving the wafer, a wafer inspection apparatus which inspects the surface of a wafer while rotating the wafer, and a semiconductor exposure apparatus which exposes and transfers a circuit pattern onto a photosensitizing agent (photoresist) filmed or coated on the surface of a wafer by irradiating light, for example.

For example, Japanese Laid-open Patent Application Publication No. 2003-324143 discloses such a wafer holder which includes a ring-like wafer receptacle around the circumferential rim of a chuck table to hold a wafer by attaching (fixing) the outer circumferential rim of the wafer onto the wafer receptacle by suction of evacuated air.

In view of preventing the wafer from contaminated or scratched, the wafer needs to avoid contact with other objects as much as possible. For example, during delivery the wafer is placed on a carrier which is configured to support the wafer only at the outer circumferential area thereof. For outer or surface inspection or surface machining of a chip on the wafer, the wafer is held by the above wafer holder when appropriate.

However, there is a problem in the prior art wafer holders that they are configured to hold the wafer on the wafer receptacle by suction so that for placing the wafer on the wafer receptacle, the wafer needs to be separated from the carrier. In the prior art the wafer is transferred from the carrier to the wafer receptacle using tweezers or the like, for example; however, this disadvantageously increases the possibility for the wafer to be made in contact with other objects.

SUMMARY OF THE INVENTION

In view of solving the above problem, the present invention aims to provide a wafer holder which can hold and move a wafer on the carrier without the wafer's made in contact with other objects.

According to one aspect of the present invention, a wafer holder comprises a holder body with a chuck table having a ring-like wafer receptacle formed around a circumferential rim thereof; and a plurality of fixing portions fixing a circumferential rim of a wafer on the wafer receptacle to hold the wafer; and a carrier in a circular shape to support the circumferential rim of the wafer before fixed on the wafer receptacle from downward and to receive the chuck table, wherein the holder body includes a carrier support portion which forms a support face to support the carrier when a receiving face of the wafer receptacle is parallel to the wafer, and to be changeable in height in a direction orthogonal to the receiving face, and positions the support face at a delivery position where the wafer is made in contact with the wafer receptacle, while the carrier is placed on the support face; and the carrier support portion separates the wafer from the carrier by lowering the support face supporting the carrier from the delivery position, so that the fixing portions fix the wafer.

Preferably, in such a wafer holder the carrier support portion is configured to position the support face at an original position higher than the delivery position while the carrier is not placed on the support face, and place the wafer on the wafer receptacle by lowering the support face supporting the carrier to or below the delivery position.

Preferably, in such a wafer holder, the carrier support portion includes a tubular member accordion-folded, extendible, and made of an elastically deformable member, and a suction mechanism being able to suction air from an inner space of the tubular member from the holder body. When the carrier is placed on the support face at the original position, the tubular member lowers, by a weight of the carrier, the support face from the original position to the delivery position, and lowers, by suction of the suction mechanism, the support face from the delivery position.

Preferably, in such a wafer holder, the tubular member includes an open upper end, and the support face is formed by the open upper end of the tubular member. Further, the carrier support portion is configured to lower the support face from the delivery position by suctioning the air from the inner space of the tubular member by the suction mechanism in a state that the open upper end of the tubular member is sealed with the carrier placed on the support face.

Preferably, in such a wafer holder, the fixing portions each include a suction hole which is open to the receiving face at one end and is sealable with the wafer placed on the wafer receptacle and through which air is suctioned by the suction mechanism.

DETAILED DESCRIPTION OF THE PREFERRED EMBODIMENT

Hereinafter, embodiment of the present invention will be described in detail with reference to the accompanying drawings.

Figure 1:
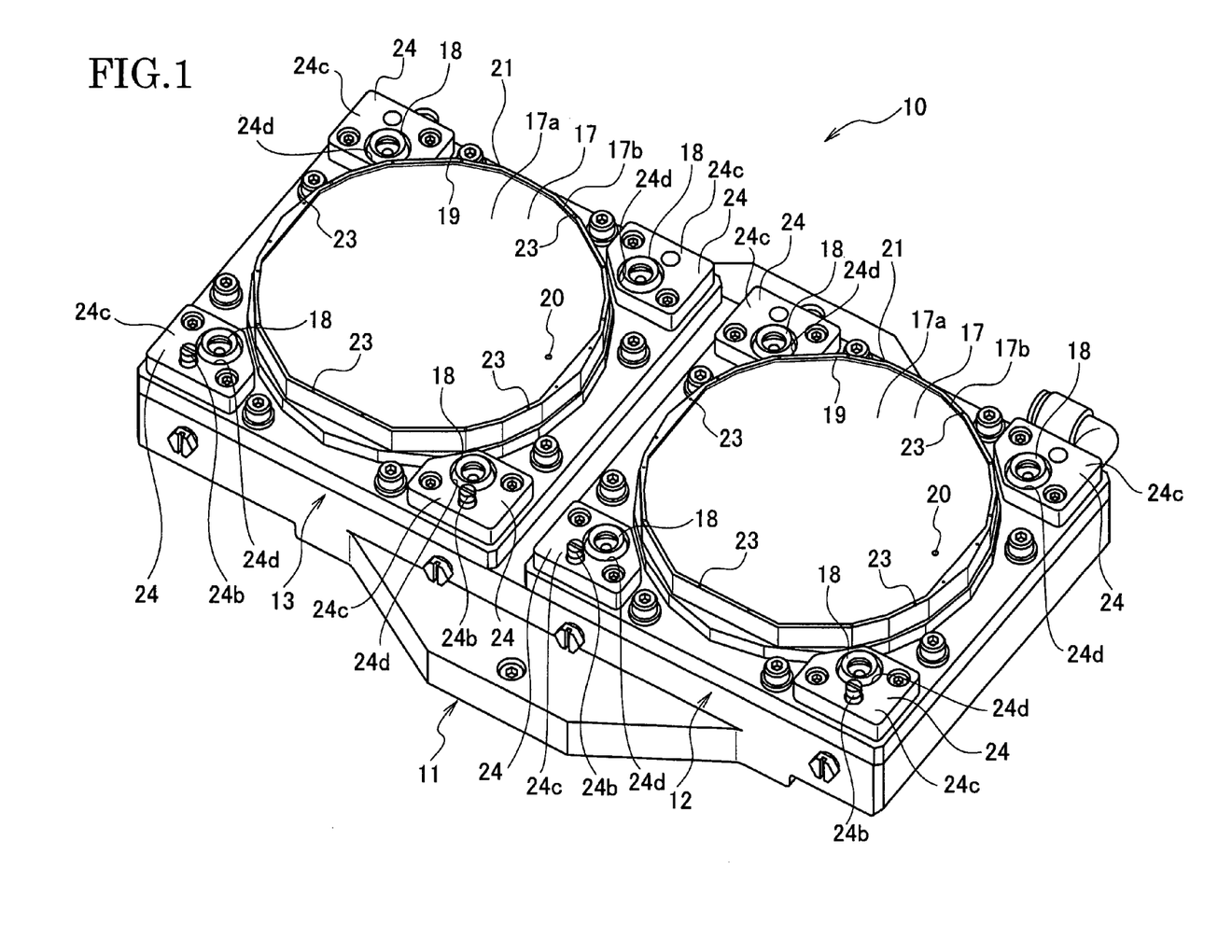
FIG. 1 is a perspective pattern diagram of a wafer holder according to the present invention.
Figure 2:
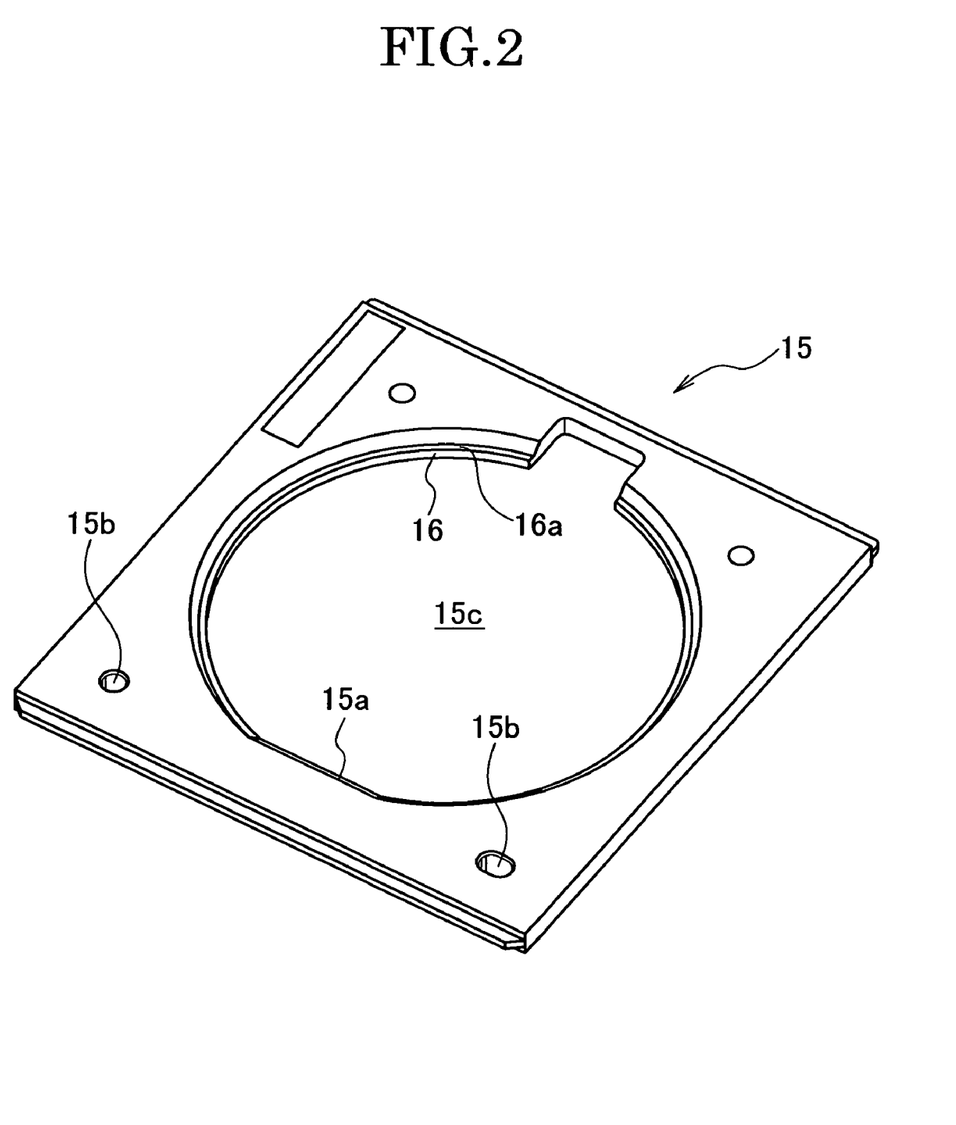
FIG. 2 is a perspective pattern diagram of a carrier on which a wafer is placed.
Figure 3:
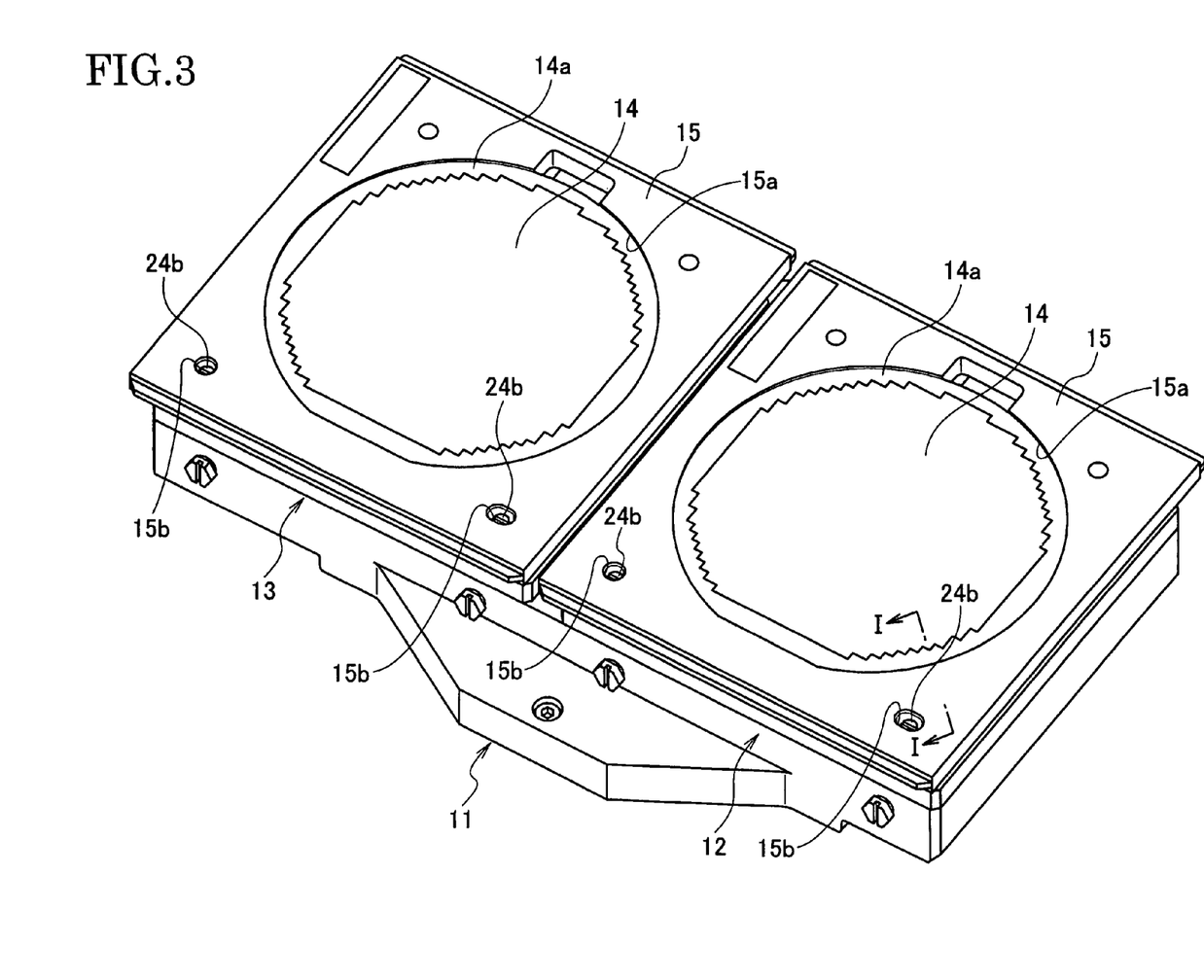
FIG. 3 is a perspective pattern diagram of the wafer holder when the carrier is appropriately placed on a support face at a delivery position and at an original position on inspection stages.
Figure 4:
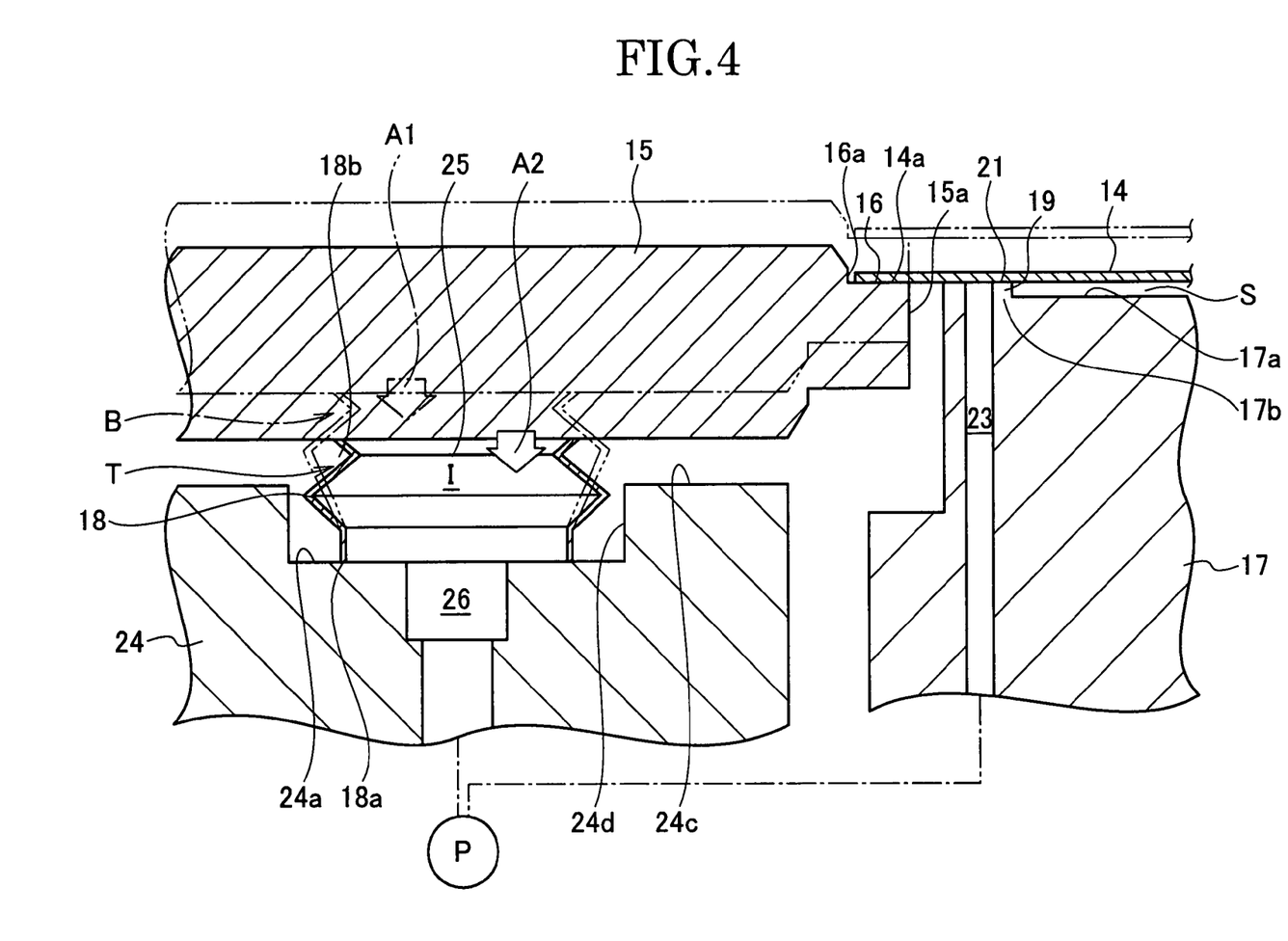
FIG. 4 is a cross sectional view of the wafer holder along the I to I line of FIG. 3.
Figure 5:
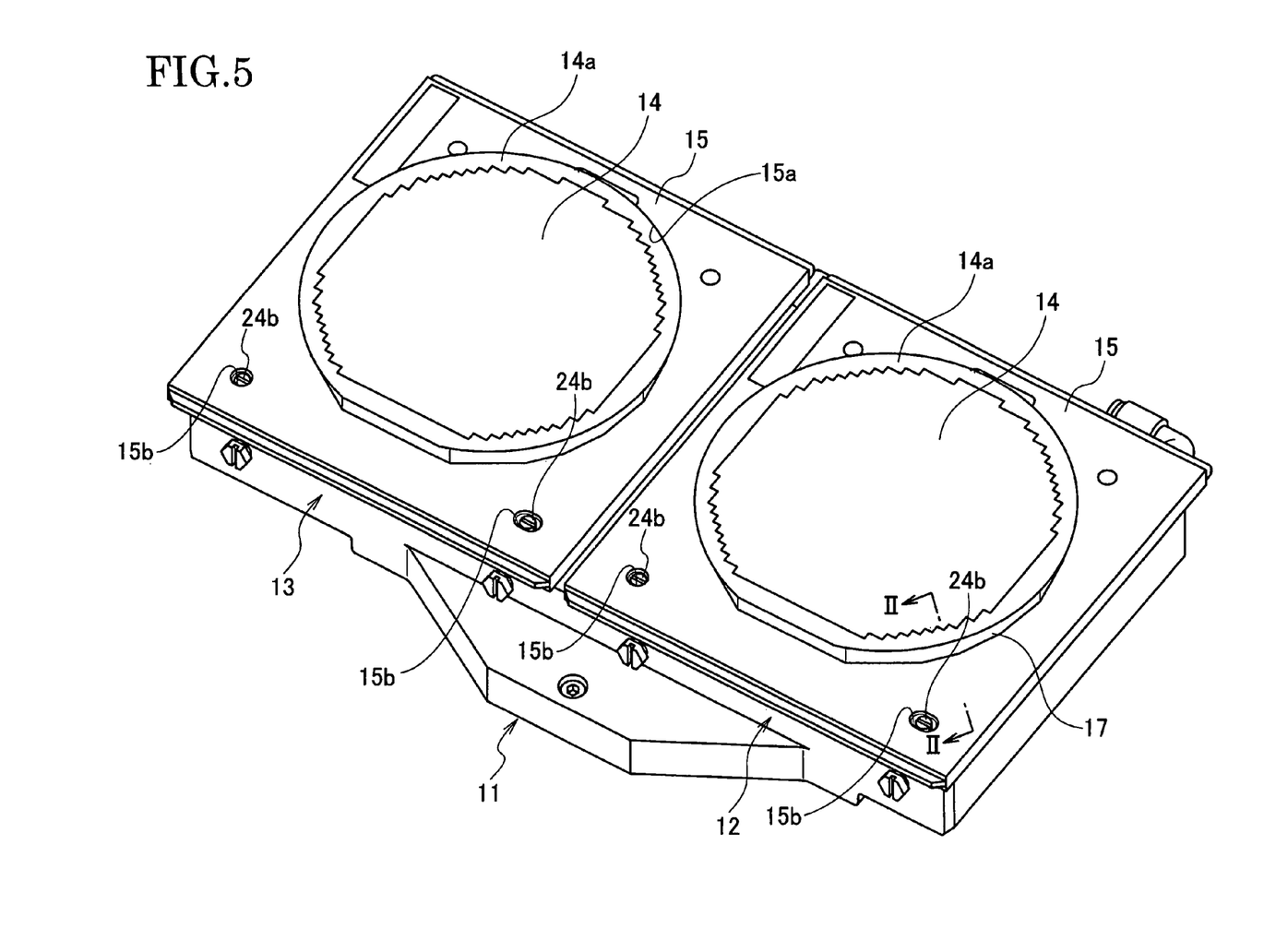
FIG. 5 is a perspective pattern diagram of the wafer holder when on the inspection stages the carrier is appropriately placed on a support face at a separation position.
Figure 6:
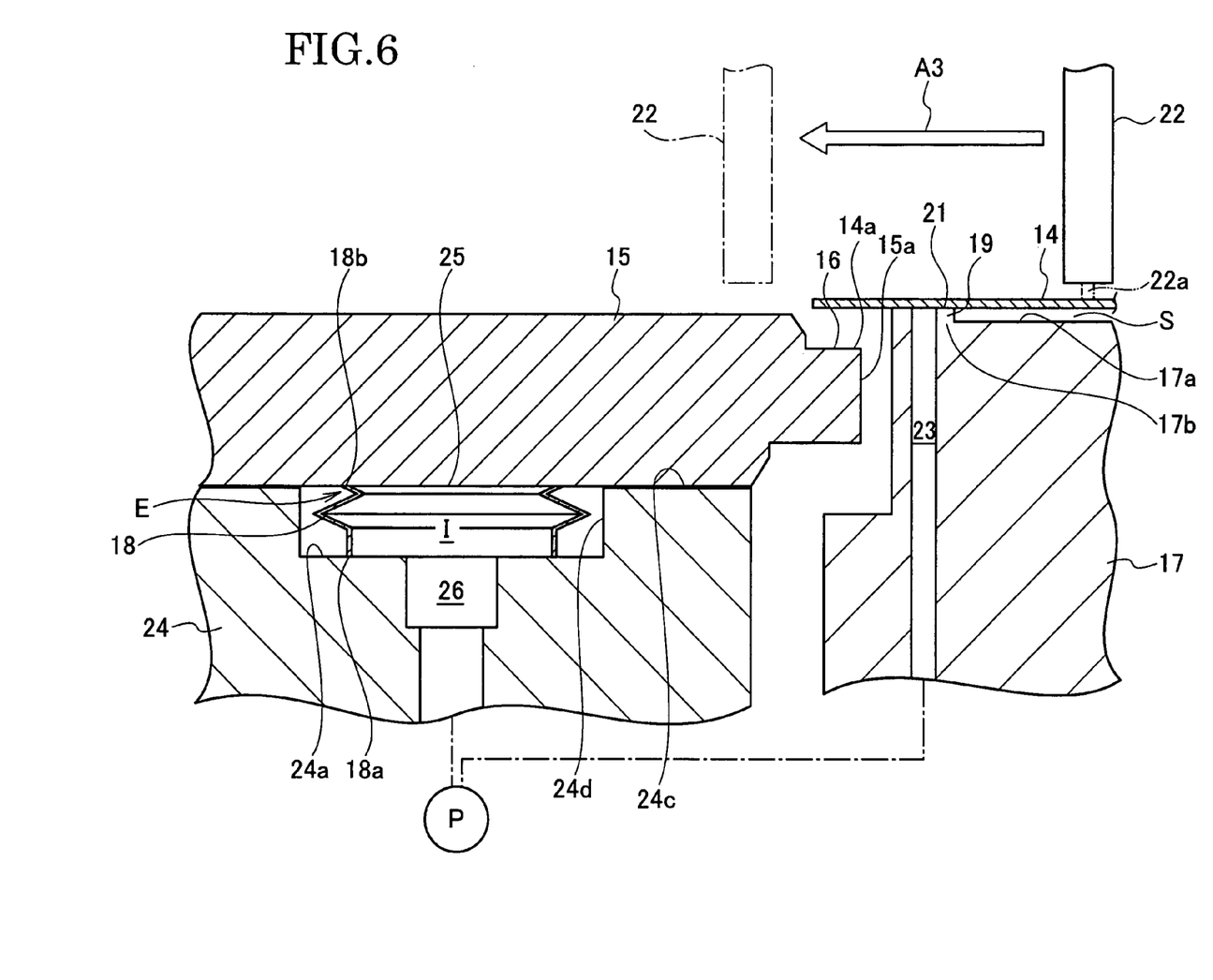
FIG. 6 is a cross sectional view of the wafer holder along the II to II line of FIG. 5.

FIG. 1 is a perspective pattern diagram of a wafer holder 10, FIG. 2 is a perspective pattern diagram of a carrier 15, and FIG. 3 is a perspective pattern diagram of the wafer holder 10 when on inspection stages 12, 13, a carrier 15 is appropriately placed on a support face (FIG. 4) at an original position B. FIG. 4 is a cross sectional view of the wafer holder 10 along the I to I line of FIG. 3, FIG. 5 is a perspective pattern diagram of the wafer holder 10 when on the inspection stages 12, 13, the carrier 15 is appropriately placed on the support face 25 (FIG. 6) at a separation position E, and FIG. 6 is a cross sectional view of the wafer holder 10 along the II to II line of FIG. 5. Note that in FIG. 5 a wafer 14 and the carrier 15 are largely separated vertically for the sake of better understanding. However, they have only to be mounted with a space on the support face 25 at the separation position E as shown in FIG. 6.

The wafer holder 10 as shown in FIG. 1 comprises a holder body having the inspection stages 12, 13 each to hold the wafer 14 by handling the carrier 15 with the wafer thereon. In the present embodiment the wafer holder 10 is configured to be an inspection device for wafer surface.

The carrier 15 in FIG. 2 includes a rectangular plate-like shape and a circular through hole 15a at the center. The circumferential rim of the through hole 15a is formed in stepwise shape (16, 16a in FIG. 4), and a face of the stepwise part is a mounting face 16 to support a circumferential rim 14a of the circular wafer 14 (FIGS. 1, 3, 5) from downward. A wall 16a is formed to extend along a face orthogonal to the mounting face 16 and prevent the movement of the wafer 14 along the mounting face 16. The carrier 15 with the wafer 14 thereon is handled on the inspection stage 12, 13 (FIG. 1). The inspection stages 12, 13 each are to separate the wafer 14 from the carrier 15 and hold it for wafer inspection. Their configurations and operations are the same so that only the inspection stage 12 will be described. Like components of the inspection stage 13 are given the same numeral codes as those of the inspection stage 12. In FIGS. 1, 3, and 5 the same operation is done on the inspection stages 12, 13 at the same time, however, only one of them can be operated.

The inspection stage 12 includes a column-like chuck table 17 insertable through a circular space 15c (FIG. 2) of the carrier 15 and four suction pads 18 surrounding the chuck table 17. The chuck table 17 includes a wafer receptacle 19 and an opening 20.

The wafer receptacle 19 has a ring-like form and protrudes upward on the entire circumferential rim 17b of an upper surface 17a of the chuck table 17 (FIGS. 1, 4, 6). The upper surface of the wafer receptacle 19 is a level surface, forming a receiving face 21. Hereinafter, a direction orthogonal to the receiving face 21 is to be a vertical direction.

One end of the opening 20 is open to the upper surface 17a of the chuck table 17 at a position more inward than that of the wafer receptacle 19 while the other end thereof is open to an outside of the chuck table not to the upper surface 17a (not shown). When the wafer 14 is appropriately placed on the receiving face 21 of the wafer receptacle 19, a space S (FIG. 4) will be formed between the upper surface 17a of the chuck table 17 and the wafer receptacle 19. The opening 20 functions to make the space S in communication with a surrounding area where the wafer holder is disposed and to have pressure thereof be equal to atmospheric pressure in the surrounding area.

The wafer receptacle 19 comprises a plurality of wafer suction holes 23. The wafer suction holes 23 are arranged with a predetermined interval on the ring-like wafer receptacle 19. As shown in FIGS. 4, 6, each suction hole 23 is open to the receiving face 21 at one end and connected with a suction device P at the other end. The wafer holder 10 is configured to hold the wafer 14 by the suction device P's suctioning air from each wafer suction hole 23 while the wafer 14 is appropriately placed on the receiving face 21 of the wafer receptacle 19. The wafer suction holes 23 function as a fixing portion to fix the wafer 14 in cooperation with the receiving face 21 of the wafer receptacle 19 and the suction device P. Below the wafer 14, the space S is formed between the upper surface 17a of the chuck table 17 and the wafer receptacle 19. The four suction pads 18 (FIG. 1) are provided to hold the wafer 14 on the wafer receptacle 19 by suction while the carrier 15 is separated from the wafer 14.

Each suction pad 18 is an accordion-folded, extendable, tubular member made of an elastically deformable member. Bottom ends 18a of the respective suction pads 18 are airtightly attached to carrier support plates 24 (bottom surface of recess 24d to be described later). Upper ends 18b of the respective suction pads 18 are set to be on the same plane orthogonal to the vertical direction and form a support face 25 to provide a support for the carrier 15 from downward. The support face 25 is therefore parallel to the receiving face 21 of the wafer receptacle 19. Appropriately placing the carrier 15 on the support face 25 can seal an inner space I of each suction pad 18. In other words, the opening of each upper end 18b is airtightly closed.

In this embodiment, appropriately placing the carrier 15 on the inspection stage 12 means appropriately placing it on the support face 25 formed by the upper ends 18b of the suction pads 18. The wafer 14 is placed on the carrier 15 positioned on the support face 25. The positional relation among the carrier 15, the wafer receptacle 19, and the wafer 14 is decided so that the wafer 14 is properly placed on the receiving face 21 of the wafer receptacle 19 by moving the carrier 15 with the wafer 14 thereon in parallel in the vertically direction.

The carrier support plates 24 each include a protrusion 24b (FIG. 1) corresponding to a locator hole 15b of the carrier 15 to prevent the carrier 15 supported on the support face 25 from displacing. They also each include a recess 24d which is open to the top end surface 24c thereof and accommodate each suction pad 18 when shrunk. Top end surfaces 24c of the carrier support plates 24 are set to be on the same plane orthogonal to the vertical direction. Each suction pad 18 is airtightly attached to the bottom surface 24a of the recess 24d.

The size and dimension of each suction pad 18 without any load from outside are set so that the mounting face 16 of the carrier 15 is positioned more upward than the receiving face 21 of the wafer receptacle 19, that is, the wafer 14 on the carrier 15 on the support face 25 is positioned above the receiving face 21 with an interval. This position of the support face 25 at this time is defined to be the original position B (FIG. 4).

Each suction pad 18 is shrinkable to a position at which the mounting face 16 of the carrier 25 on the support face 25 goes lower than the receiving face 21 of the wafer receptacle 19 to be accommodated in the recess 24d. This position of the support face 25 is defined to be the separation position E (FIG. 6). Given a load from the outside, each suction pad 18 is shrinkable to move the support face 25 to the separation position E while free from the load from the outside, it can return to the original size by its own restoring force (elastic force) to move the support face 25 to the original position B.

Moreover, when the carrier 15 with the wafer 14 thereon is mounted on the support face 25 formed by the upper ends 18b in cooperation with each other, the weight of the carrier 15 and the wafer 14 causes each suction pad 18 to shrink so that the support face 25 is gradually moved downward in parallel (arrow A1 in FIG. 4) from the original position B to a delivery position T (FIG. 4). The support face 25 supports only the carrier 15 at the delivery position T (higher than the separation position E). The suction pads 18 are configured to have such a spring force as not to extend/shrink when the support face 25 is at the delivery position T.

Each carrier support plate 24 further includes a carrier suction hole 26 to lower the support face 25 of the suction pad 18 to the separation position E.

Each carrier suction hole 26 is open to the bottom surface 24a of the recess 24d at one end to be in communication with the inner space I of the suction pad 18 while it is connected with the suction device P at the other end. Each carrier suction hole 26 and each wafer suction hole 23 are connected with the single suction device P at their other ends. In the wafer holder 10 according to the present embodiment, the inspection stages 12, 13 are connected with the suction device P, and the suction holes in communication with the suction device P can be selectively open or close when necessary. Either or both of the inspection stages 12, 13 can be operated by the suction device P.

When the carrier 15 is mounted on the support face 25 properly to seal each inner space I, the suction device P suctions the air from each inner space I and depressurizes it. Thereby, the carrier 15 is attached to each suction pad 18 and at the same time each suction pad 18 is shrunk so that the support face 25 formed by the upper ends 18b descends to the separation position E (FIGS. 5, 6). Thus, the suction pads 18 each function as a carrier support portion in cooperation with the carrier suction hole 26 and the suction device P.

Next, the operation of the wafer holder 10 will be described.

An operator carries the carrier 15 with the wafer 14 thereon to the inspection stage 12 (or inspection stage 13) and places it properly on the support face 25 (indicated by chain double-dashed lines in FIGS. 3, 4) at the original position B. Then, the carrier 15 airtightly seals the inner space I of each suction pad 18 and the weight of the wafer 14 and carrier 15 causes the suction pad 18 to shrink, thereby lowering the support face 25 in parallel from the original position B to the delivery position T (indicated by arrow A1 in chain double-dashed lines in FIG. 4). As described above, each suction pad 18 is configured to be shrinkable until the support face 25 lowers to the separation position E (FIG. 6), and the chuck table 17 with the wafer receptacle 19 is configured to be insertable into the circular space 15c of the carrier 15. Accordingly, the wafer 14 on the carrier 15 supported by the support face 25 is come in contact with the receiving face 21 of the wafer receptacle 19 from upward while the support face 25 moves from the original position B (FIG. 4) to the separation position E (FIG. 6), or each suction pad 18 is shrunk. Here, the wafer 14 on the carrier 15 is supported at its outer circumference 14a by the mounting face 16 from downward, in other words, the upward movement thereof is free from restriction. Because of this, the wafer 14 is transferred from the mounting face 16 of the carrier 15 to the receiving face 21 of the wafer receptacle 19 by moving the mounting face 16 downward below the receiving face 21. The delivery position T (FIG. 4) is a position of the support face 25 of each suction pad 18 when the wafer 14 is transferred from the carrier 15 to the wafer receptacle 19. Each suction pad 18 is set to have such a strength (spring force) as not to extend or shrink while the support face 25 is at the delivery position T (upper than the separation position E), supporting only the carrier 15. Therefore, the suction pad 18 stops moving upward or downward when supporting the carrier 15 at the delivery position T. That is when the support face 25 is at the delivery position T, the mounting face 16 of the carrier 15 is located on the same plane on which the receiving face 21 of the wafer receptacle 19 is, or slightly below the receiving face 21.

Appropriate placement of the carrier 15 on the support face 25 means that the wafer 14 on the carrier 15 is placed properly on the receiving face 21 of the wafer receptacle 19. When the support face 25 of each suction pad 18 is at the delivery position T and the carrier 15 is placed appropriately on the receiving face 21, the downward movement of the wafer 14 is restricted by the receiving face 21 while the movement thereof along a face orthogonal to vertical direction is restricted by the wall 16a surrounding the mounting face 16 of the carrier 15 (FIG. 4). Accordingly, the wafer 14 can be prevented from being displaced from the proper position on the receiving face 21 even when the wafer holder 10 is moved.

Then, the suction device P is operated to suction the air from the airtightly sealed inner spaces I of the suction pads 18 and wafer suction holes 23. This causes the wafer 14 on the receiving face 21 of the wafer receptacle 19 to be attached onto the wafer receptacle 19, and at the same time the carrier 15 to be attached onto the suction pads 18 due to depressurization of the inner spaces I. In this state, the suction pads 18 get shrunk so that the support face 25 formed by the upper ends 18b thereof is moved downward from the delivery position T (arrow A2 in FIG. 4) to the separation position E (FIG. 6). In such a manner, the wafer holder 10 according to the present embodiment can separate the wafer 14 from the carrier 15 to hold the wafer 14 by suction and also hold the separated carrier 15 on the support face 25 at the separation position E by suction. In the present embodiment, the wafer holder 10 can hold the wafer 14 and the carrier 15 at different positions by the suction in parallel to the plane orthogonal to the vertical direction. That is, with the support face 25 being at the separation position E, each suction pad 18 is accommodated in the recess 24d, the carrier 15 is placed on the top end surface 24c of the carrier support plate 24 on the same plane, and the upper surface of the carrier 15 comes below that of the wafer 14 attached to the wafer receptacle 19.

The suction device P is set to have suction force enough to suction the air from the inner spaces I and the wafer suction holes 23 and maintain the holding of the wafer 14 on the wafer receptacle 19 and the holding of the carrier 15 by the suction pad 18.

In the inspection stage 12, a desired operation is performed on the wafer 14 while the wafer 14 and the carrier 15 are separately held. According to the present embodiment as shown in FIG. 6, a not-shown chip on the wafer 14 is inspected. When a chip is found to be defective during the inspection, it will be given a bad mark with an inker 22 (fountain pen). In order to prevent the carrier 15 from interfering with the marking operation, the wafer holder 10 is configured that the upper surface of the carrier 15 is positioned below that of the wafer 14. That is, in marking process, the inker 22 is relatively moved in parallel to the upper surface of the wafer 14 (arrow A3) and at a position 0.2 mm to 0.5 mm higher than that and the pen tip of the inker 22 protrudes to a marking point on the upper surface. In a case where the inker 22 relatively moves in parallel above the carrier 15 (indicated by chain doubled-dash lines and arrow A3) but not above the wafer 14, and the upper surface of the carrier 15 is above that of the wafer 14, the inker 22 and the carrier 15 may interfere with each other.

After completion of a desired operation to the held wafer 14, the suction device P is operated to release the holding of the wafer 14 on the wafer receptacle 19 and of the carrier 15 on the suction pad 18. The returning force of the suction pad 18 causes the support face 25 to move upward from the separation position E (FIG. 6) to the original position B via the delivery position T (FIG. 4).

In this ascending process, the mounting face 16 of the ascending carrier 15 is made in contact with the released wafer 14 from downward (delivery position T), and the wafer 14 is supported by the mounting face 16 in replace of the receiving face 21. Thereby, the wafer 14 can be properly placed on the mounting face 16 of the carrier 15. As shown in FIG. 4, when the support face 25 of the suction pad 18 comes at the delivery position T, the carrier 15 with the wafer thereon is properly set on the support face 25. Then, the carrier 15 is unloaded from the mounting face 16 to handle the wafer 14 thereon. By unloading of the carrier 15, the suction pad 18 returns to be in the original size by its own elastic force and the support face 25 returns to the original position B.

As described above, since the wafer holder 10 separates the wafer 14 from the carrier 15 and holds it on the receiving face 21 of the wafer receptacle 19 by suction, it can avoid the wafer 14 from getting in contact with other components except for the receiving face 21 in the process of the separation and holding. The wafer holder 10 is able to hold the wafer 14 properly in contact with only the mounting face 16 of the carrier 15 which will be otherwise made in contact with the wafer 14 during delivery or else and the receiving face 21 which receives the wafer 14.

After separating the wafer 14 and carrier 15 and holding them individually, the wafer holder 10 can properly place the wafer 14 on the mounting face 16 of the carrier 15 while avoiding the wafer 14 from getting in contact with other components except for the receiving face 21. Therefore, with use of the wafer holder 10, a desired operation can be performed to the wafer 14 properly placed on the mounting face 16 of the carrier 15, namely, the carrier 15. This eliminates necessity for the operator to touch the wafer 14 and prevents the wafer 14 from getting in contact with other components except for the mounting face 16.

Further, with the wafer holder 10, the operator can handle the carrier 15 instead of the wafer 14, so that he/she is not required to be so attentive or careful as much as in handling the wafer 14. Because of this, it is possible to reduce preparation time for a desired operation to the wafer 14 and keep the wafer 14 from being contaminated or scratched accidentally during the preparation.

In the wafer holder 10, while the wafer 14 and the carrier 15 are held separately, the wafer 14 can be subjected to a desired operation. Accordingly, it is possible to prevent a carrier 15 from moving and interfering with the operation and prevent occurrence of dust due to the moving carrier 15.

In the wafer holder 10, the other ends of the carrier suction holes 26 and those of the wafer suction holes 23 are connected with the single suction device P. By the suction of the single suction device P as power source, the holding of the wafer 14 and the carrier 15 as well as the vertical movement of the support face 25 of the carrier support portion can be achieved.

Moreover, the wafer holder 10 is configured to deliver the wafer 14 between the receiving face 21 of the wafer receptacle 19 and the mounting face 16 of the carrier 15 by vertically moving the mounting face 16. In comparison with holding and moving the wafer 14 between the two faces, the wafer 14 is less likely to be contaminated or scratched.

Further, the wafer holder 10 is configured to deliver the wafer 14 between the mounting face 16 and the receiving face 21 by vertically moving the mounting face 16 to reverse the vertical positions thereof. This enables the wafer 14 to be securely held even with an error in relative heights of the receiving face 21 and mounting face 16. In contrast, in a case where the wafer on the carrier is integrally held, the relative heights of the receiving face and the mounting face are crucial to the secure holding of the wafer. That is, when the mounting face is higher than the receiving face, the wafer cannot be held on the receiving face by suction while when the receiving face is higher than the mounting face, the wafer will be fallen out of the mounting face before held on the receiving face.

In the wafer holder 10, when the wafer 14 on the carrier 15 is placed on the support face 25 at the original position B, the weight of the wafer 14 and carrier 15 causes the support face 25 to slowly lower, thereby transferring the wafer 14 from the mounting face 19 to the receiving face 21. This can prevent the wafer 14 from being contaminated or scratched.

Furthermore, the wafer holder 10 comprises the chuck table 17 with the opening 20. Provision of the opening 20 can prevent the space S between the wafer 14 and the upper surface 17a of the chuck table 17 from negatively pressurized due to the air suction from the wafer suction hole 23 while the wafer is held on the wafer receptacle 19 by suction. This results in preventing deflection of the wafer 14 due to the negative pressure of the space S.

Further, the wafer holder 10 can hold the wafer 14 and the carrier 15 separately with the upper surface of the carrier 15 being lower than that of the wafer 14. Because of this, the carrier 15 is preventable from interfering with a desired operation such as the chip inspection on the wafer 14 and marking with the inker 22 in the present embodiment.

Further, the wafer holder 10 is configured to limit the downward movement of the wafer 14 by the receiving face 21 and movement thereof along the face orthogonal to the vertical direction by the wall 16a while the support face 25 of the suction pad 18 remains at the delivery position T and the wafer 14 is properly placed on the receiving face 21. Therefore, even before the suction device P is operated, the wafer 14 cannot be displaced from the right position on the receiving face 21.

Further, the wafer holder 10 comprises the two inspection stages 12, 13 to hold the separated wafer 14 and carrier 15 properly, which enables performing a desired operation to the wafer 14 efficiently.

The wafer holder 10 achieves the holding of the separated wafer 14 and carrier 15 on the inspection stage 12, 13 by suction of the single suction device P. That is, the wafer holding, the separation of the wafer 14 and the carrier 15, and the carrier holding on both the inspection stages 12 and 13 can be all done by the suction of the suction device P as power source.

As described above, the wafer holder 10 according to the present embodiment can hold the wafer 14 on the carrier 15 without increasing the possibility for the wafer 14 made in contact with other objects.

The above embodiment has described the suction device P as a fixing portion which suctions air from the wafer suction holes 23 to hold the wafer 14 on the wafer receptacle 19. However, the present invention is not limited thereto. As long as the wafer is fixed on the wafer receptacle 19, the fixing portion can be configured of a plurality of hooks to fix the wafer on the wafer receptacle.

The above embodiment has described an example where the wafer holder 10 inspects a chip on the wafer 14. However, the present invention is not limited to such an example. The wafer holder 10 is applicable to a semiconductor exposure device which exposes and transfers a circuit pattern onto a photosensitizing agent (photoresist) filmed or coated on the surface of the wafer by irradiating light, a wafer carrier device which holds and carries the wafer, or the like.

The above embodiment has described an example where the suction pad 18 and carrier suction hole 26, and suction device P constitute a carrier support portion. However, the present invention is not limited thereto. Other configurations are applicable as long as the wafer delivery between the mounting face and the receiving face is achievable by vertically moving the support face supporting the carrier to reverse the positional relation between the mounting face of the carrier and the receiving face of the wafer receptacle.

The above embodiment has described an example where the other end of each carrier suction hole 26 and that of each wafer suction hole 23 are connected with the single suction device P. However, the present invention is not limited thereto. They can be connected with different suction devices individually.

The above embodiment has described such a configuration that properly placing the carrier 15 on the support face 25 leads to sealing the inner spaces I of the suction pads 18, enabling the carrier 15 to be held by suction. However, the present invention is not limited thereto. For example, a plate member can be provided on the upper end of each suction pad to use the upper surface of the plate member as the support face 25. In this example, although the carrier separated from the wafer cannot be held by suction, the holding of the wafer on the wafer receptacle and the vertical movement of the support face by the carrier support portion are feasible.

According to the present invention, the wafer holder is configured to include the carrier support portion in simple configuration which can separate the carrier from the wafer and place the wafer on the wafer receptacle. By setting the strength (spring force) of the tubular member such that the tubular member is gradually shrunk by the weight of the wafer and the carrier from the original position to the delivery position, it is possible to prevent the wafer from getting contaminated or scratched when placing it on the wafer receptacle.

According to the present invention, the wafer holder is configured to include the carrier support portion in simple configuration so that the carrier after separated from the wafer can be also fixed on the carrier support portion of the holder body at the placement of the wafer on the wafer receptacle.

According to the present invention, the wafer holder is configured so that the air suction of the suction mechanism results in lowering the support face of the carrier support portion as well as fixing the wafer on the wafer receptacle. Accordingly, the carrier support portion and fixing portions can be driven by the common driving force.

Although the present invention has been described in terms of exemplary embodiments, it is not limited thereto. It should be appreciated that variations may be made in the embodiments described by persons skilled in the art without departing from the scope of the present invention as defined by the following claims.

What is claimed is:

1. A wafer holder comprising:
   a holder body with a chuck table having a ring-like wafer receptacle formed around a circumferential rim thereof; and a plurality of fixing portions fixing a circumferential rim of a wafer on the wafer receptacle to hold the wafer; and
   a carrier in a rectangular plate-like shape including a circular hole to support from downward the circumferential rim of the wafer before fixed on the wafer receptacle and to receive the chuck table, wherein:
   the holder body includes a carrier support portion which forms a support face to support the carrier when a receiving face of the wafer receptacle is parallel to the wafer, and to be changeable in height in a direction orthogonal to the receiving face, and positions the support face at a delivery position where the wafer is made in contact with the wafer receptacle, while the carrier is placed on the support face; and
   the carrier support portion separates the wafer from the carrier by lowering the support face supporting the carrier from the delivery position, so that the fixing portions fix the wafer.

2. A wafer holder according to claim 1, wherein:
   the carrier support portion is configured to position the support face at an original position higher than the delivery position while the carrier is not placed on the support face, and place the wafer on the wafer receptacle by lowering the support face supporting the carrier to or below the delivery position.

3. A wafer holder according to claim 2, wherein:
   the carrier support portion includes a tubular member accordion-folded, extendible, and made of an elastically deformable member, and a suction mechanism being able to suction air from an inner space of the tubular member from the holder body; and
   when the carrier is placed on the support face at the original position, the tubular member lowers, by a weight of the carrier, the support face from the original position to the delivery position, and lowers, by suction of the suction mechanism, the support face from the delivery position.

4. A wafer holder according to claim 3, wherein:
   the tubular member includes an open upper end;
   the support face is formed by the open upper end of the tubular member; and
   the carrier support portion is configured to lower the support face from the delivery position by suctioning the air from the inner space of the tubular member by the suction mechanism in a state that the open upper end of the tubular member is sealed with the carrier placed on the support face.

5. A wafer holder according to claim 4, wherein the fixing portions each include a suction hole which is open to the receiving face at one end and is sealable with the wafer placed on the wafer receptacle and through which air is suctioned by the suction mechanism.

6. A wafer holder according to claim 3, wherein the fixing portions each include a suction hole which is open to the receiving face at one end and is sealable with the wafer placed on the wafer receptacle and through which air is suctioned by the suction mechanism.

* * * * *